United States Patent [19]

Merrill et al.

[11] Patent Number: 4,783,694

[45] Date of Patent: Nov. 8, 1988

[54] INTEGRATED BIPOLAR-MOS SEMICONDUCTOR DEVICE WITH COMMON COLLECTOR AND DRAIN

[75] Inventors: Perry L. Merrill, Mesa; Rodney R. Stoltenburg, Phoenix, both of Ariz.

[73] Assignee: Motorola Inc., Schaumburg, Ill.

[21] Appl. No.: 590,235

[22] Filed: Mar. 16, 1984

[51] Int. Cl.$^4$ .................................. H01L 27/02
[52] U.S. Cl. .................................. 357/51; 357/46; 357/34; 357/36; 357/43; 357/23.4; 357/86
[58] Field of Search .............. 357/46, 43, 34, 86, 357/51, 36, 23.4, 28

[56] References Cited

U.S. PATENT DOCUMENTS

| | | | |
|---|---|---|---|
| 3,702,947 | 11/1972 | Schilling | 357/46 X |
| 3,813,588 | 5/1974 | Ring | 357/46 X |
| 3,821,780 | 6/1974 | Harland, Jr. et al. | 357/36 |
| 3,913,213 | 10/1975 | Mills et al. | 29/577 |
| 4,072,975 | 2/1978 | Ishitani | 357/23 |
| 4,145,700 | 3/1979 | Japibotkar | 357/23 |
| 4,198,693 | 4/1980 | Kuo | 365/104 |
| 4,199,774 | 4/1980 | Plummer | 357/41 |
| 4,206,469 | 6/1980 | Hanes et al. | 357/23 |
| 4,288,807 | 9/1981 | Enzlin et al. | 357/81 |
| 4,329,705 | 5/1982 | Baker | 357/43 |
| 4,366,522 | 12/1982 | Baker | 357/43 X |
| 4,430,663 | 2/1984 | D'Altroy et al. | 357/86 X |
| 4,441,117 | 4/1984 | Zommer | 357/43 |
| 4,489,341 | 12/1984 | Mayrand | 357/51 |

FOREIGN PATENT DOCUMENTS

| | | | |
|---|---|---|---|
| 3210353 | 9/1983 | Fed. Rep. of Germany | 357/46 |
| 0142184 | 12/1978 | Japan | 357/46 |
| 0065269 | 11/1982 | Japan | 357/63 |
| 0092263 | 6/1983 | Japan | 357/46 |
| 0165374 | 9/1983 | Japan | 357/46 |
| 2097585 | 11/1982 | United Kingdom | 357/46 |

OTHER PUBLICATIONS

Plummer et al., "Insulated-Gate Planar Thyristors: I-Structure and Basic Operation," *IEEE Transactions on Electron Devices*, vol. ED-27, No. 2, Feb. 1980, pp. 380-387.

David et al., "A New V.MOS/Bipolar Darlington Transistor for Power Applications," *IEEE Electron Devices Meeting*, Wash., D.C., 1980, pp. 83-86.

"SCR's Go Mos" *Semiconductor International*, Oct. 1982, pp. 9-10.

*Primary Examiner*—Andrew J. James
*Assistant Examiner*—William A. Mintel
*Attorney, Agent, or Firm*—Robert M. Handy

[57] ABSTRACT

The safe operating area can be increased and the die area can be decreased for a monolithic Darlington circuit employing an MOS input transistor and bipolar output transistor by subdividing the bipolar transistor into a multiplicity of rectangular spaced apart bipolar device regions, each of which is surrounded by an annular shaped MOS device region. The source and channel of the MOS devices are formed in an extension of the base of the bipolar devices. The substrate serves as a common collector for all the bipolar device regions and as a common drain for all the MOS device regions. The gate electrode, which runs over the interstices between the parallel spaced apart bipolar device areas is covered by an insulator so that the emitter metallization may extend substantially over the entire upper surface of the die. A more compact layout and better thermal coupling between the MOS and bipolar devices are obtained. These features reduce the total die area and improve the thermal stability of the circuit.

9 Claims, 4 Drawing Sheets

INTEGRATED BIPOLAR-MOS SEMICONDUCTOR DEVICE WITH COMMON COLLECTOR AND DRAIN

BACKGROUND OF THE INVENTION

1. Field of the Invention

This invention relates in general to means and methods for semiconductor devices and, more particularly, to improved means and mtthods for providing semiconductor devices combining both MOS and bipolar transistors to provide a Darlington type circuit.

2. Background Art

The Darlington circuit configuration is well-known and is frequently used in the semiconductor art to obtain devices which have high gain and high power output. In its most common configuration, the Darlington circuit consists of two devices, connected to a common supply, and with the output of the first (input) device connected to the input of the second (output) device which is in turn connected in series with the load. The input and output devices of the Darlington circuit may be bipolar type devices, MOS type devices, or a mixture of the two. When the input device is formed from an MOS transistor and the output device from a bipolar transistor, the Darlington arrangement has particularly attractive properties.

It is desirable for both performance and economy reasons to build both transistors of the Darlington circuit in a single semiconductor die. In the prior art, the MOS-Bipolar Darlington combination has been implemented by forming a large bipolar transistor on one part of the semiconductor die and a smaller MOS transistor on another part of the die in a side-by-side arrangement. The MOS and bipolar devices are then connected together using surface metallization layers.

Prior art MOS-bipolar Darlington circuits made in this fashion have a number of disadvantages. For example, die area utilization is poor. Thus, a larger and more costly semiconductor die is required to achieve a given power output. Further, devices constructed in this fashion have smaller Safe Operating Area (SOA) and are more susceptible to thermal-runaway since thermal coupling between the MOS and bipolar devices is generally poor and little benefit is derived from the fact that they have compensating current-temperature characteristics. Additionally, when it is desired to add feedback resistors within the circuit, additional die space is required, further increasing the cost and complexity. Thus, there is a need for improved means and methods for constructing monolithic Darlington circuits and devices. As used herein the words device or semiconductor device or semiconductor circuit are intended to include monolithic implementation of circuits comprising one or more transistors, resistors, or other components.

Accordingly, it is an object of the present invention to provide an improved means and method for constructing semiconductor circuits employing MOS and bipolar devices in the same semiconductor die.

It is a further object of the present invention to provide an improved means and method for constructing monolithic Darlington circuits employing MOS and bipolar ransistors in a more compact arrangement to decrease the die area required.

It is an additional object of the present invention to provide an improved means and method for obtaining integrated feedback resistors in Darlington circuits.

It is a further object of the present invention to provide a means and method for improving the thermal stability, more particularly, the safe operating area (SOA) of monolithic Darlington circuits employing MOS and bipolar transistors.

It is a still further object of the present invention to provide improved means and methods for obtaining monolithic Darlington circuits having large electrode contacts for the main power leads so as to minimize series resistance.

SUMMARY OF THE INVENTION

These and other objectives and advantages are achieved through the present invention wherein there is provided a semiconductor device comprising a bipolar transistor with emitter, base, and collector regions and an MOS transistor having source, drain, channel, and gate regions, connected in a Darlington configuration. To achieve a compact layout, the emitter and base of the bipolar transistor are divided into a multiplicity of parallel connected rectangular shapes arranged in a parallel spaced apart fashion. The MOS and bipolar devices are intermingled by forming the source and channel regions of the MOS transistor in extensions to the base regions of the bipolar transistor lying in the interstices separating the rectangular parallel spaced apart emitter regions. The source regions of the MOS transistor have a rectangular annular shape and are located surrounding each of the multiplicity of rectangular spaced apart emitter regions. The drain of the MOS transistor and the collector of the bipolar transistor are common, and are provided by the substrate of the semiconductor die. The gate of the MOS transistor overlies the channel regions which lie in the intricies between the rectangular spaced apart emitter regions.

In a preferred embodiment there are a multiplicity of parallel connected MOS transistors, each of which surrounds one of the multiplicity of parallel connected bipolar transistors. The source regions of the MOS transistor and the base regions of the bipolar transistor are shorted together at their common boundary by a metallic electrode which is insulated from the emitter and the gate.

It is desirable to provide a feedback resistor between the emitter of the bipolar transistor and the source of the MOS transistor. The lateral resistance of the base region of the bipolar transistor is utilized to provide this resistance so that no additional die surface area is required to implement the resistor. This is accomplished by providing localized shorts between the emitter and base of the bipolar transistor along the center lines of the emitter regions, and shorting together the source of the MOS transistor and the base of the bipolar transistor at the periphery of the emitter regions. A very compact Darlington circuit is thereby obtained.

A large area emitter contact is obtained by running the emitter contact electrode over the interstices separating the long dimensions of the emitter regions. The portion of the gate regions lying within the interstices are separated from the emitter electrode by an insulating layer. The invented arrangement permits extremely low resistance contacts to be made to the emitter and collector of the bipolar transistor, which form the main power leads of the device.

DETAILED DESCRIPTION OF THE PREFERRED EMBODIMENT

For convenience, the present invention is illustrated in terms of a silicon semiconductor device containing one or more MOS transistors and bipolar transistors and having a particular combination of n-type and p-type regions. These are intended merely as an aid to understanding. Those of skill in the art will understand that the description is not limited to the particular examples shown but applies as well to other semiconductor materials and doping combinations.

Figure 1:
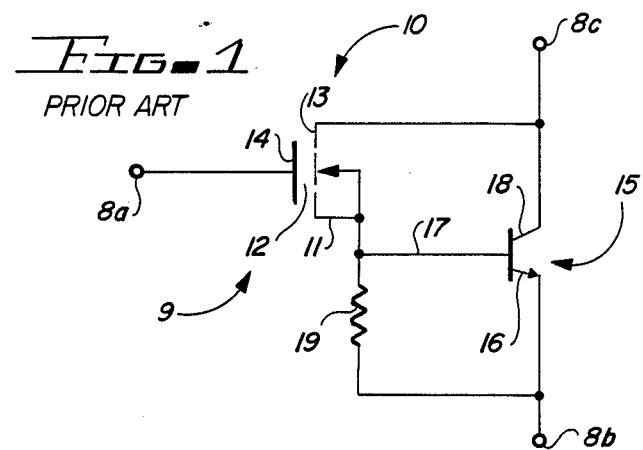
FIG. 1 is a schematic drawing of a Darlington circuit containing an MOS input device, a bipolar output device, and a feedback resistor.

FIG. 1 shows conventional Darlington circuit 9 consisting of MOS input transistor 10 having source 11, channel 12, drain 13, and gate 14. MOS input transistor 10 is combined with bipolar output transistor 15 in a typical Darlington configuration. Source 11 of transistor 10 is connected to base 17 of bipolar transistor 15, and drain 13 is tied to collector 18. Feedback resistor 19 is connected between emitter 16 and the common connection of base 17 and source 11. This arrangement gives the well-known Darlington arrangement in which terminal 8a serves as the input, terminal 8b serves as the output connected to the load, and terminal 8c is connected to the power supply.

Figure 2A:
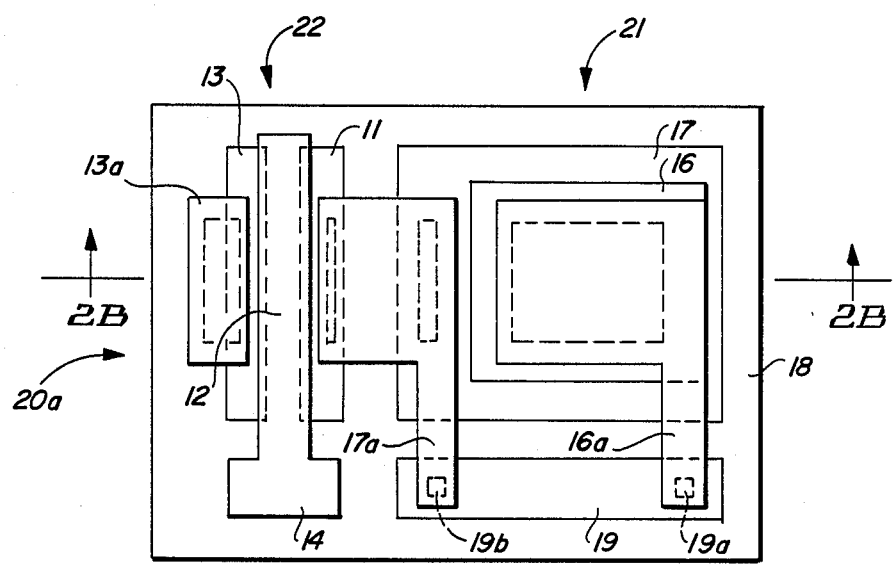
FIGS. 2A-B show, in schematic form, a top view and a cross-sectional view, respectively, of a monolithic embodiment of the Darlington circuit of FIG. 1, according to the prior art.
Figure 2B:
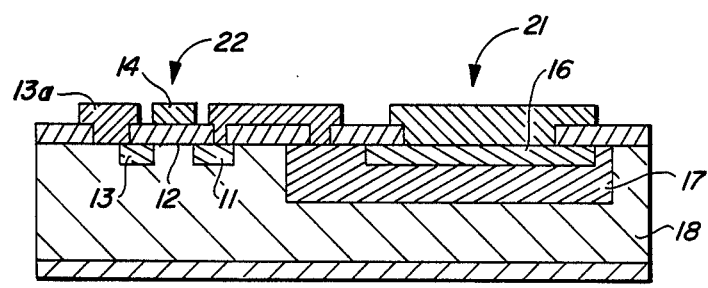

FIGS. 2A-B show, respectively, a top view and cross-sectional view in simplified form of a prior art embodiment of the circuit of FIG. 1. Semiconductor die 20 has located therein bipolar transistor 21 and MOS transistor 22. For simplicity, the various device regions in FIGS. 2A-B are labeled using the same identifying numerals as shown on the circuit of FIG. 1. Bipolar transistor 21 has emitter region 16, base region 17, and collector region 18. MOS transistor 22 has source region 11, channel region 12, drain region 13, and gate electrode 14. Resistor region 19 is connected to emitter 16 at contact 19a by means of emitter metallization 16a, and is connected to base region 17 at contact 19b by means of base interconnect metallization 17a. Base interconnect metallization 17a also interconnects base 17 and source 11. (See FIG. 2A). Drain metallization 13a connects drain 13 to collector region 18 of semiconductor die 20.

When the semiconductor die of FIGS. 2A-B is energized, substantial amounts of heat may be generated within bipolar transistor 21. If bipolar transistor 21 has a large area, as is often the case when it is desired to handle substantial amounts of power, the lateral separation of the centers of bipolar device 21 and MOS device 22 will be significantly greater than the thickness of die 20. As a consequence, there is only partial thermal coupling between bipolar device 21 and MOS device 22. Accordingly, there is little opportunity for the positive temperature coefficient of resistance characteristic of MOS device 22 to act as a temperature variable compensating resistor which opposes the negative temperature coefficient of resistance characteristic of bipolar device 21. Under these circumstances, thermal runaway will occur more easily and the device will have a smaller safe operating area (SOA) than might otherwise be possible.

Further, the area of semiconductor die 20 is not efficiently used with the prior art side-by-side arrangement of transistors 21 and 22, and resistor 19. Accordingly, a larger die area must be provided for the same total power handling capability. This increases the manufacturing cost.

Figure 3:
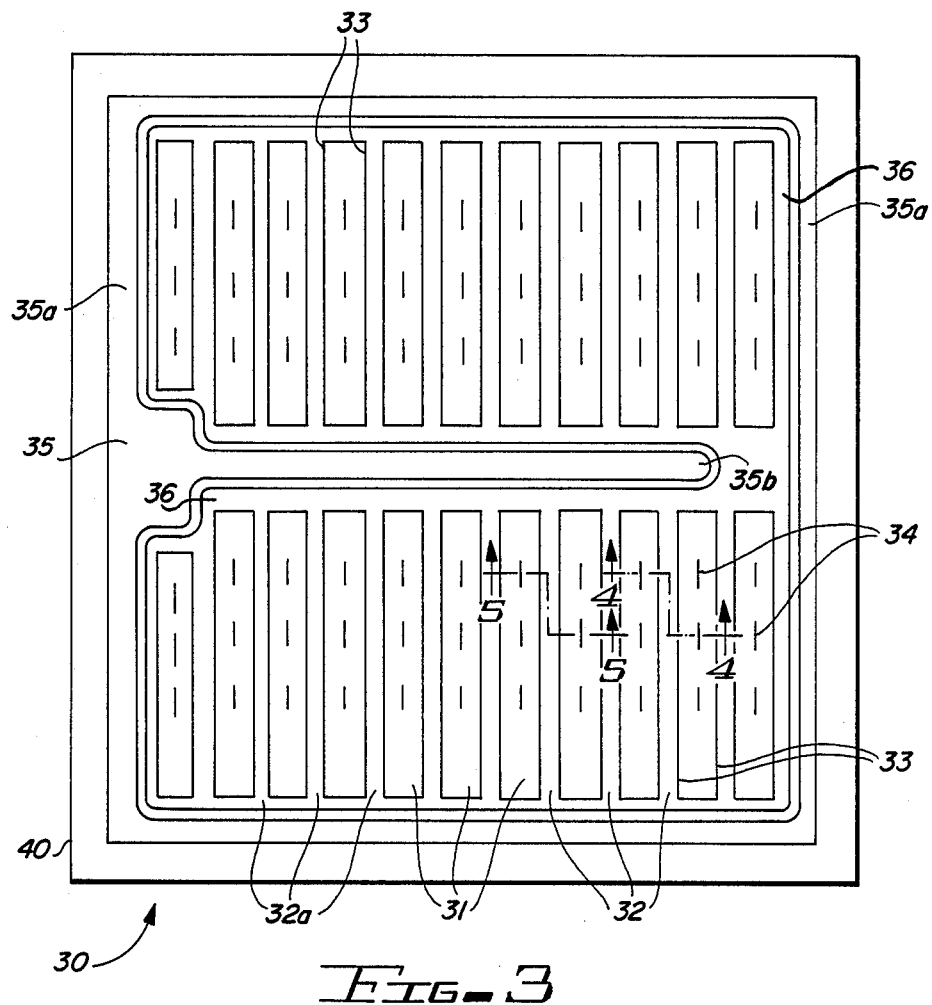
FIG. 3 shows in simplified form a top view of a monolithic semiconductor device embodying the circuit of FIG. 1 according to the present invention.
Figure 4:
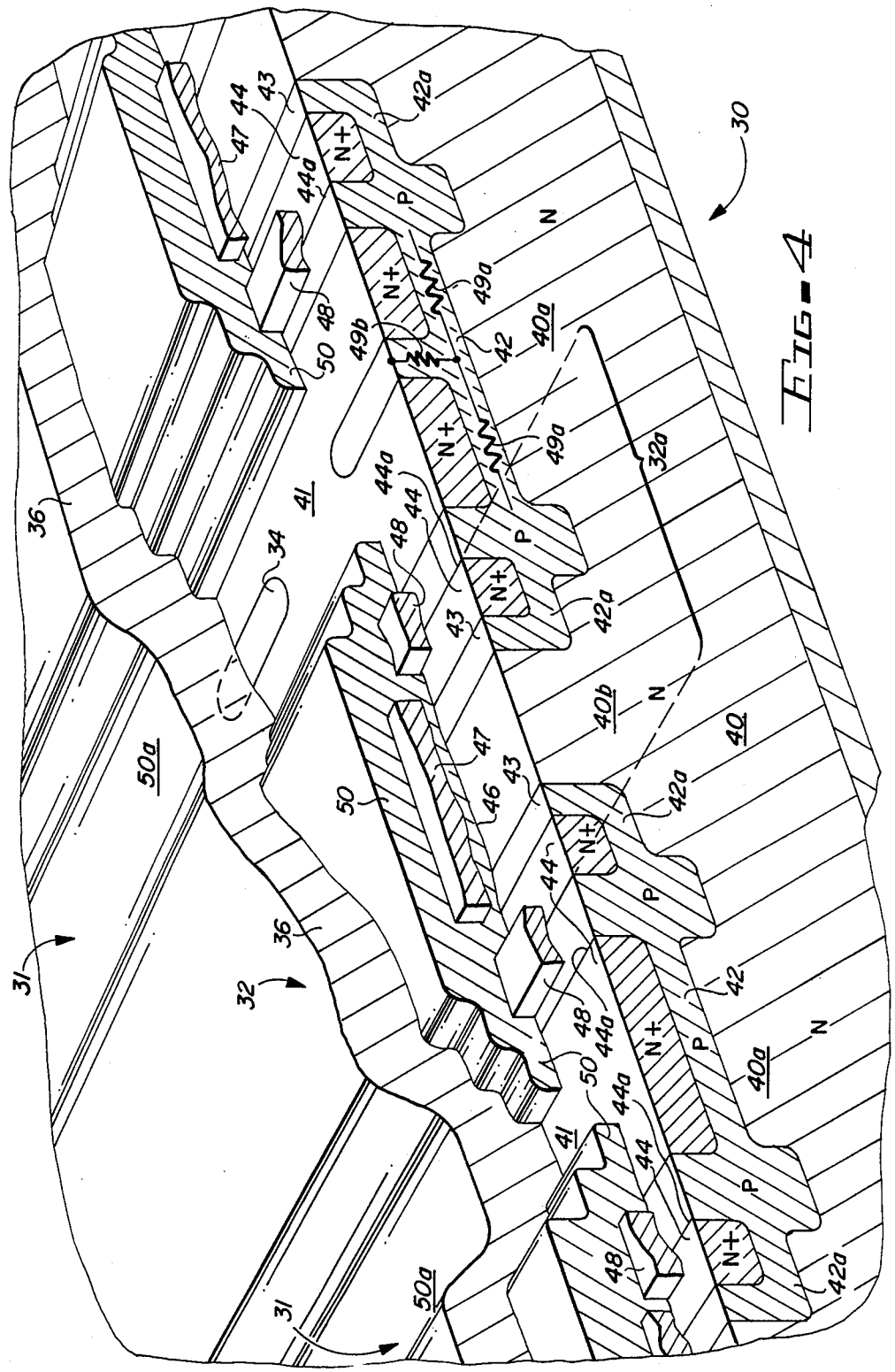
FIG. 4 shows in simplified form a combined partial cutaway and cross-sectional view, greatly enlarged, of a portion of the device of FIG. 3.

These and other problems may be avoided and other improvements attained by utilizing the device layout of the present invention. A preferred embodiment is illustrated in FIGS. 3 and 4. FIG. 3 shows a top view, in greatly simplified form, of semiconductor device 30 embodying Darlington circuit 9 of FIG. 1 according to the present invention. For simplicity, only the general features of semiconductor device 30 are shown in FIG. 3. Additional details concerning the arrangement of the various device regions and device layers are provided in FIGS. 4 and 5, which show portions of device 30 of FIG. 3 in greatly enlarged form.

In semiconductor device 30 of FIG. 3, bipolar transistor 15 of Darlington circuit 9 of FIG. 1 is implemented by means of a multiplicity of rectangular bipolar device regions 31 arranged in parallel spaced apart fashion, separated by intersticies 32. Multiple bipolar regions 31 are connected together in parallel to form transistor 15 of circuit 9. Similarly, a multiplicity of parallel connected MOS device regions 32a are used to form MOS transistor 10 of circuit 9. Bipolar device regions 31 and MOS device regions 32a are intermingled. MOS device regions 32a have an annular shape corresponding substantially to perimeter 33 of rectangular bipolar device regions 31. MOS device regions 32a are located surrounding bipolar device regions 31 in intersticies 32 between parallel spaced apart bipolar device regions 31. Metallization layer 36 connects the emitter portions of multiple bipolar transistor regions 31 together in parallel. Substrate 40 serves as a common drain region for MOS device regions 32a and a common collector region of bipolar device regions 31.

The details of the structure of semiconductor device 30 of FIG. 3 can be better appreciated by reference to FIG. 4. FIG. 4 shows, in simplified form, a combined partial cutaway and cross-sectional view of a portion of the device of FIG. 3, greatly enlarged. Substrate 40 has therein multiple bipolar transistor regions 31 comprising emitter regions 41, base regions 42, and collector regions 40a. Base regions 42 of multiple bipolar device regions 31 are separated by interstices 32. Base regions 42 have extensions 42a in which are formed source regions 44 and channel regions 43. Portions 40b of substrate 40 serve as the common drain region for MOS transistors 32a composed of source regions 44, channel regions 43, and gates or gate electrodes 47. Channel regions 43 of MOS transistors 32a are covered by insulating layer 46 on which are formed gate electrodes 47. Insulating layer 46 is conveniently formed of silicon dioxide, and gate electrodes 47 are conveniently formed of polysilicon. Source regions 44 of MOS transistors 32a and base regions 42 of bipolar device regions 31 are shorted together at their common periphery 44a by conductive stripes 48. Conductive stripes 48 need not connect to other portions of the circuit. Stripes 48 are conveniently formed of any highly conductive material which makes ohmic contact to the semiconductor. Metals, semi-metals, intermetallics, or highly doped semiconductors are well known examples.

Spaced substantially along the center line of emitter regions 41 are regions 34 in which no emitter diffusion has been provided. Regions 34 are shown in FIG. 3 and in the right hand portions of FIGS. 4 and 5. In regions 34, base region 42 of bipolar device regions 31 protrudes through emitter regions 41 to the surface of the semiconductor. Insulating layer 50 covers base-source shorting stripes 48 and gates 47. Emitter contact electrode 36 is placed on top of insulating layer 50. In the left portion of FIG. 4, insulating layer 50 is illustrated as having striped shaped contact window 50a wherein emitter metallization layer 36 makes contact to the central portion of emitter region 41. In the right half of FIG. 4, insulating layer 50 is illustrated as having striped shaped contact window 50a which exposes both the central portion of emitter 41 and region 34 into which protrudes a portion of base region 42. In the right half of FIG. 4, metallization layer 36 contacts both emitter region 41 and base region 42 in region 34, providing a localized short circuit between emitter region 41 and a portion of base region 42. By making region 34 relatively narrow and base region 42 comparatively thin, lateral resistances 49a-b are created in the material of base region 42 connected between emitter electrode 36 where it contacts region 34 and shorting stripes 48 at the junction between base 42 and source regions 44. Distributed resistances 49a-b provide feedback resistance 19 of FIG. 1. This arrangement has several advantages. First, a more compat circuit is obtained, since no additional area is required for implementing resistor 19 beyond that already occupied by base region 42. Second, the direct contact by emitter metallization 36 to base 42 in regions 34 permits stored charge to be rapidly removed from base 42 during device turn-off. This substantially reduces the turn-off time of the bipolar transistor and improves the overall performance of the Darlington circuit.

Viewing FIGS. 3 and 4 together, it will be understood that bipolar device regions 31, comprising emitter regions 41 and base regions 42, have a rectangular shape and are separated by interstices 32. Extensions 42a of base region 42 extend out from under emitters 41 into interstices 32 substantially all around rectangular bipolar device regions 31. Source regions 44 and channel regions 43 have a substantially annular shape and desirably surround emitter regions 41. Thus, in a preferred embodiment each bipolar device region 31 is encircled by an MOS device region lying along its periphery 33. Substrate 40 serves the dual function of providing collector region 40a for bipolar device regions 31 and drain region 40b of MOS devices 32a. No separate drain contact or collector contact need be provided on the upper surface of substrate 40. The invented device configuration is extremely simple to manufacture because source regions 44 and emitter regions 41 can be provided using a single mask and are self-aligned. These arrangements provide an extremely compact structure which makes maximum use of the available die area.

A further advantage of the invented structure is that large area contacts are available for the power leads of the device, that is, the emitter and collector of the bipolar device. This reduces the series contact resistance. It is desirable that gate electrode 47 cover substantially all portions of die 30 not occupied by bipolar device regions 31. Thus, it is convenient that gate electrode 47 cover interstices 32 between bipolar device regions 31 as well as the center and the periphery of die 30 of FIG. 3. Gate metallization 35 has peripheral border 35a and central finger 35b. This permits a low resistance contact to be readily made to gate electrode 47. Gate metallization 35 is conveniently made of an aluminum-silicon alloy and gate electrode 47 is conveniently made of polysilicon. Gate electrode 47 is desirably covered by insulating layer 50 except where contact is desired between gate metallization 35 and gate 47. Insulating layer 50 permits emitter metallization 36 to cover substantially all of the remainder of the surface of die 30. Emitter metallization 36 not only contacts emitters 41 but runs on top of insulator 50 across interstices 32. As can be seen in FIG. 3, the portion of the die inside peripheral border 35a and outside central finger 35b is substantially covered entirely by emitter metallization 36. This provides a large surface area for contact to emitter metallization 36 and thus to emitters 41 of bipolar devices regions 31. Contact to substrate 40, which is the common collector of the bipolar device and common drain of the MOS device, is conveniently made by contact metallization layer 40c on the lower surface of die 30 (see FIG. 5). Thus, large area contacts are provided to the emitter and collector of the bipolar output device.

Figure 5:
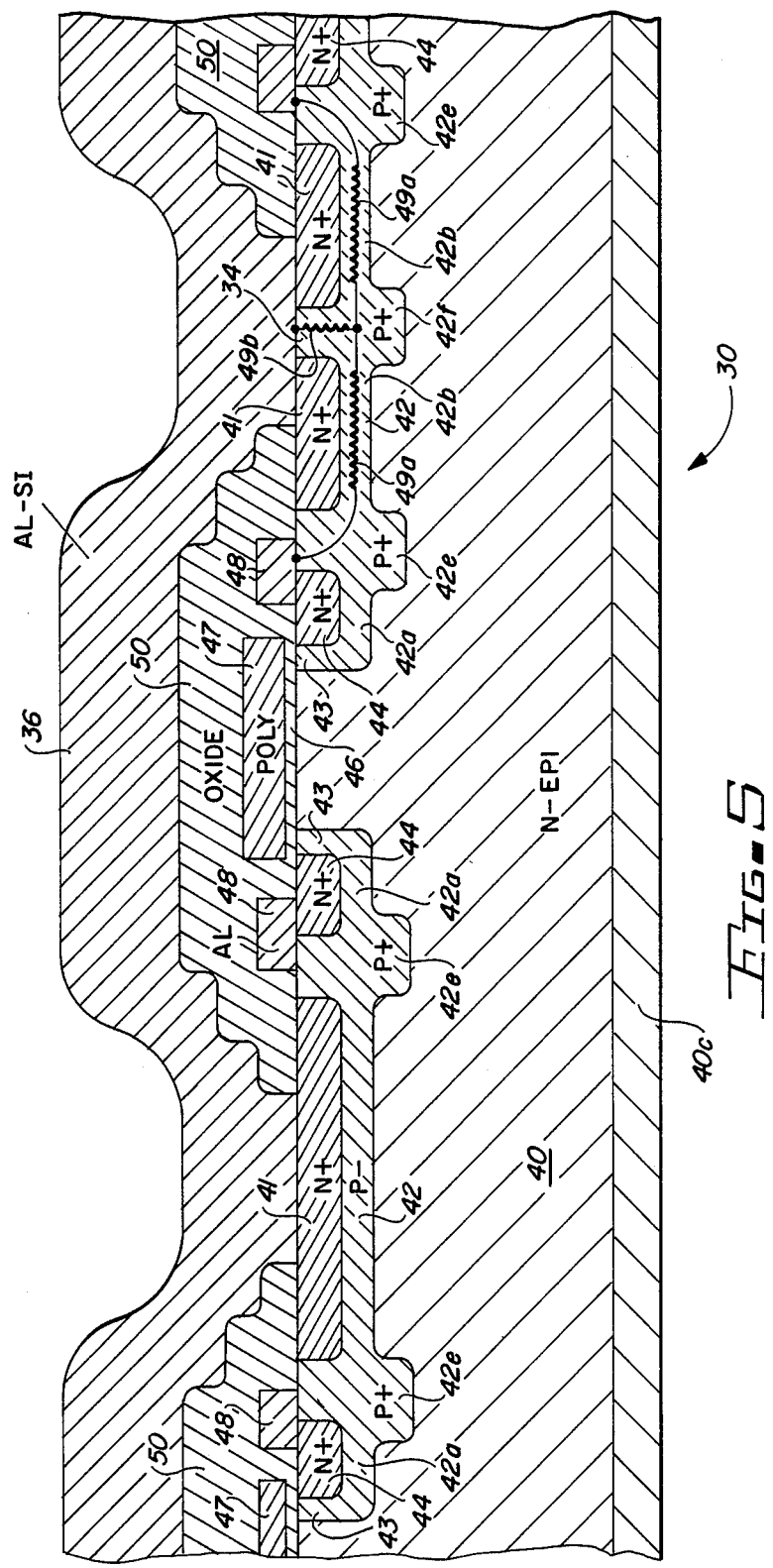
FIG. 5 shows a cross-sectional view, greatly enlarged, of the device of FIG. 3, according to a further embodiment.

A further embodiment of the present invention is illustrated in FIG. 5 wherein the doping of base region 42 in extension portions 42a and central portions 34 has been enhanced in regions 42e-f in order to facilitate low resistance ohmic contact between base region 42 and metallization layers 48 and 36. As in FIG. 4, FIG. 5 illustrates in the left half the arrangement whereby emitter metallization 36 contacts only emitter 41, and in the right half, the arrangement whereby emitter metallization 36 contacts emitter 41 and a portion of base 42 in region 34, to provide a localized short circuit between emitter and base at the periphery of region 34.

In FIGS. 4 and 5, the bipolar device regions and MOS device regions have been illustrated for the case of an NPN bipolar transistor and an N-channel MOS transistor. Those of skill in the art will understand that these designations are intended merely to facilitate understanding, and that other combinations of doping types could also be utilized.

An advantage of the arrangement of MOS and bipolar devices illustrated in FIGS. 3-5 is that the MOS device regions surround the bipolar device regions. In contrast to the prior art wherein the MOS device and bipolar devices were not intermingled and so had active areas which were separated by a significant distance, the present invention employs a multiplicity of intermingled MOS and bipolar device regions which are therefore more closely packed. This arrangement substantially improves the thermal coupling between the bipolar device regions and the MOS device regions. Thus, as the bipolar device regions increase in temperature, the adjacent MOS device regions which are driving the bipolar device regions will similarly increase in temperature. As the MOS device regions become hotter the channel resistance increases and in turn reduces the drive to the base of the adjacent bipolar device regions.

This increases the thermal stability and the safe operating area of the Darlington combination.

Thus, it is apparent that there has been provided in accordance with this invention an improved means and method for employing MOS and bipolar devices in monolithic Darlington circuits, and the like. In particular, the invented means provides a more compact arrangement so that a smaller die area is utilized and further, as a result of the close proximity between the bipolar and MOS device regions, the thermal stability and safe operating area of the circuit is improved.

We claim:

1. A semiconductor device having a surface, comprising:
    a bipolar transistor having emitter, base, and collector regions, wherein said emitter and base regions extend to said surface of said device;
    an emitter electrode extending over a first portion of said surface and contacting said emitter region and a first portion of said first base region; and
    an MOS transistor, substantially surrounding said bipolar transistor, and having source, drain, and channel regions extending to said surface, and having a gate electrode extending above said channel region, wherein said source and channel regions are formed in a second portion of said base region extending from the periphery of said emitter region and wherein said drain and collector regions are common.

2. The device of claim 1 further comprising shorting means at a junction between said source and base regions, and integrated resistor means in said base region extending from said shorting means to said first portion of said base region.

3. The device of claim 2 wherein said first portion of said base region is laterally surrounded by said emitter region.

4. The device of claim 2 wherein said shorting means is insulated from said emitter region, said emitter electrode, and said gate electrode.

5. The device of claim 1 further comprising at least two separate parallel spaced-apart emitter regions and at least two separate annular source regions arranged so that each of said separate spaced-apart emitter regions is surrounded by one of said separate annular source regions.

6. The device of claim 1 further comprising at least first and second elongated parallel spaced-apart base regions and first and second elongated parallel spaced-apart emitter regions, wherein said first and second elongated parallel spaced-apart base regions have an elongated gap therebetween, and wherein said first and second elongated spaced-apart base regions laterally enclose, respectively, said first and second elongated emitter regions, and wherein the portions of said first and second elongated spaced-apart base regions adjacent said elongated gap contain, respectively, first and second elongated source regions separated from said gap by first and second elongated channel regions lying in said first and second elongated spaced-apart base regions between said first and second elongated source regions and said gap, and wherein a common elongated gate electrode overlies said first and second elongated channel regions and said elongated gap.

7. The device of claim 6 further comprising an insulator overlying a portion of said gate electrode, and wherein said emitter electrode overlies said insulator.

8. The device of claim 7 wherein said emitter electrode substantially covers the portion of said gate electrode that overlies said gap.

9. The device of claim 6 wherein said emitter electrode extends from said first elongated emitter region, across the portions of said first elongated base, source, and channel regions adjacent said elongated gap, across the portion of said elongated gate region covering said elongated gap, across the portions of said second elongated channel, source, and base regions adjacent said elongated gap, and to said second elongated emitter region.

* * * * *